US012568788B2

(12) United States Patent (10) Patent No.: US 12,568,788 B2
Myung et al. (45) Date of Patent: Mar. 3, 2026

(54) SEMICONDUCTOR PACKAGE MANUFACTURING APPARATUS AND SEMICONDUCTOR PACKAGE MANUFACTURING METHOD USING THE SAME

(71) Applicant: Samsung Electronics Co., Ltd., Suwon-si (KR)

(72) Inventors: Woo Ram Myung, Suwon-si (KR); Dae Ung Park, Suwon-si (KR); Oh Chul Kwon, Suwon-si (KR); Seon Young Kim, Suwon-si (KR); Yun-Sik Yoo, Suwon-si (KR); Jun Ho Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 18/303,158

(22) Filed: Apr. 19, 2023

(65) Prior Publication Data

US 2023/0395404 A1 Dec. 7, 2023

(30) Foreign Application Priority Data

Jun. 3, 2022 (KR) ........................ 10-2022-0068205

(51) Int. Cl.
H01L 21/67 (2006.01)
H01L 21/687 (2006.01)
(52) U.S. Cl.
CPC .. H01L 21/67132 (2013.01); H01L 21/68742 (2013.01)
(58) Field of Classification Search
CPC ......... H01L 21/67132; H01L 21/68742; B32B 43/006
See application file for complete search history.

(56) References Cited

U.S. PATENT DOCUMENTS 6,186,216 B1 * 2/2001 Bolde ................. H01L 21/4853
164/347
7,470,120 B2 12/2008 Cheng
(Continued)

FOREIGN PATENT DOCUMENTS

KR 10-2010-0007350 A 1/2010
KR 10-2010-0050432 A 5/2010
(Continued)

OTHER PUBLICATIONS

Translation of Office Action issued Nov. 13, 2025 in Korean Application No. 10-2022-0068205 (original foreign language document submitted by IDS on Dec. 4, 2025) (Year: 2025).*
(Continued)

*Primary Examiner* — George R Koch
(74) *Attorney, Agent, or Firm* — Harness, Dickey & Pierce, P.L.C.

(57) ABSTRACT

A semiconductor package manufacturing apparatus is provided, which comprises a pin holder including a plurality of through holes, a plurality of ejector pins corresponding to the plurality of through holes, a first pin disk including a first protrusion pattern having a first arrangement configured to adjust heights of the plurality of ejector pins, a second pin disk including a second protrusion pattern having a second arrangement configured to adjust the heights of the plurality of ejector pins, and a controller configured to select at least a portion of the plurality of ejector pins to protrude toward an upper portion of the pin holder by selecting one of the first and second pin disks.

18 Claims, 29 Drawing Sheets

1001

(56)                  References Cited

U.S. PATENT DOCUMENTS

2006/0003491 A1*   1/2006   Kim .................. H01L 21/67132
                                                   438/106
2007/0128306 A1*   6/2007   Cheung ............ H01L 21/67132
                                                   425/444
2021/0354355 A1*   11/2021   Cheng .............. H01L 21/67132

FOREIGN PATENT DOCUMENTS

| | | | | | | |
|---|---|---|---|---|---|---|
| KR | 10-2014-0055104 | A | | 5/2014 | | |
| KR | 2014055104 | A | * | 5/2014 | ....... | H01L 21/67092 |
| KR | 10-2015-0137322 | A | | 12/2015 | | |
| KR | 10-2017-0103136 | A | | 9/2017 | | |
| KR | 10-1791787 | B1 | | 10/2017 | | |
| KR | 1791787 | B1 | * | 10/2017 | ....... | H01L 21/67712 |
| KR | 10-2017-0137329 | A | | 12/2017 | | |
| KR | 10-2018-0029852 | A | | 3/2018 | | |
| KR | 10-2020-0033177 | A | | 3/2020 | | |

OTHER PUBLICATIONS

Office Action issued Nov. 13, 2025 in Korean Application No. 10-2022-0068205.

* cited by examiner

SEMICONDUCTOR PACKAGE MANUFACTURING APPARATUS AND SEMICONDUCTOR PACKAGE MANUFACTURING METHOD USING THE SAME

CROSS-REFERENCE TO RELATED APPLICATION

This application claims priority from Korean Patent Application No. 10-2022-0068205 filed on Jun. 3, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor package manufacturing apparatus and a semiconductor package manufacturing method using the same.

Description of the Related Art

Generally, semiconductor devices may be formed on a semiconductor wafer used as a semiconductor substrate by repeatedly performing a series of manufacturing processes on the wafer. Since the wafer on which the semiconductor devices are formed may be divided into a plurality of dies through a dicing process, the dies may be bonded onto the substrate through a bonding process.

To this end, a die ejecting unit configured to be driven in a vertical direction to separate a die from a wafer and a pickup unit for picking up the die from the wafer and attaching the die to a substrate may be used.

The die ejecting unit may include a plurality of ejector pins to separate the die from a tape. Meanwhile, when a size of the die to be bonded is changed, a change in the number and position of the ejector pins may be required. The number and position of the ejector pins may be changed by a worker, but a problem may occur in that the time required for the change in the number and position of the ejector pins is increased depending on the skill of the worker.

BRIEF SUMMARY

An object of the present disclosure is to provide a semiconductor package manufacturing apparatus for replacing ejector pins more efficiently.

Another object of the present disclosure is to provide a semiconductor package manufacturing method for replacing ejector pins more efficiently.

The objects of the present disclosure are not limited to those mentioned above, and additional objects of the present disclosure, which are not mentioned herein, will be clearly understood by those skilled in the art from the following description of the present disclosure.

A semiconductor package manufacturing apparatus according to some embodiments of the present disclosure devised to achieve the above objects comprises a pin holder including a plurality of through holes, a plurality of ejector pins corresponding to the plurality of through holes, a first pin disk including a first protrusion pattern having a first arrangement configured to adjust heights of the plurality of ejector pins, a second pin disk including a second protrusion pattern having a second arrangement configured to adjust the heights of the plurality of ejector pins, and a controller configured to select at least a portion of the plurality of ejector pins to protrude toward an upper portion of the pin holder by selecting one of the first and second pin disks.

A semiconductor package manufacturing apparatus according to some embodiments of the present disclosure devised to achieve the above objects comprises a plurality of ejector pins, a pin holder including a plurality of through holes corresponding to the plurality of ejector pins, a pin base configured to set a reference height for the plurality of ejector pins, pin disk disposed below the pin base, including a protrusion pattern configured to ascend at least a portion of the plurality of ejector pins as much as a first height spaced from the reference height, and a controller configured to select the portion of the plurality of ejector pins to protrude toward an upper portion of the pin holder by selecting the pin disk.

A semiconductor package manufacturing method according to some embodiments of the present disclosure devised to achieve the above objects uses a semiconductor package manufacturing apparatus, which comprises a pin holder including a plurality of through holes, a plurality of ejector pins corresponding to the plurality of through holes, a first pin disk including a first protrusion pattern having a first arrangement configured to adjust heights of the plurality of ejector pins, a second pin disk including a second protrusion pattern having a second arrangement configured to adjust the heights of the plurality of ejector pins, and a support on which at least one of the first and second pin disks is seated, and comprises selecting at least a portion of the plurality of ejector pins to protrude toward an upper portion of the pin holder by replacing the at least one of the first pin disk or second pin disk on the support with the other of the first pin disk or second pin disk.

Details of the other embodiments are included in the detailed description and drawings.

BRIEF DESCRIPTION OF THE DRAWINGS

The above and other aspects and features of the present disclosure will become more apparent by describing in detail some example embodiments thereof with reference to the attached drawings, in which:

Figure 9:
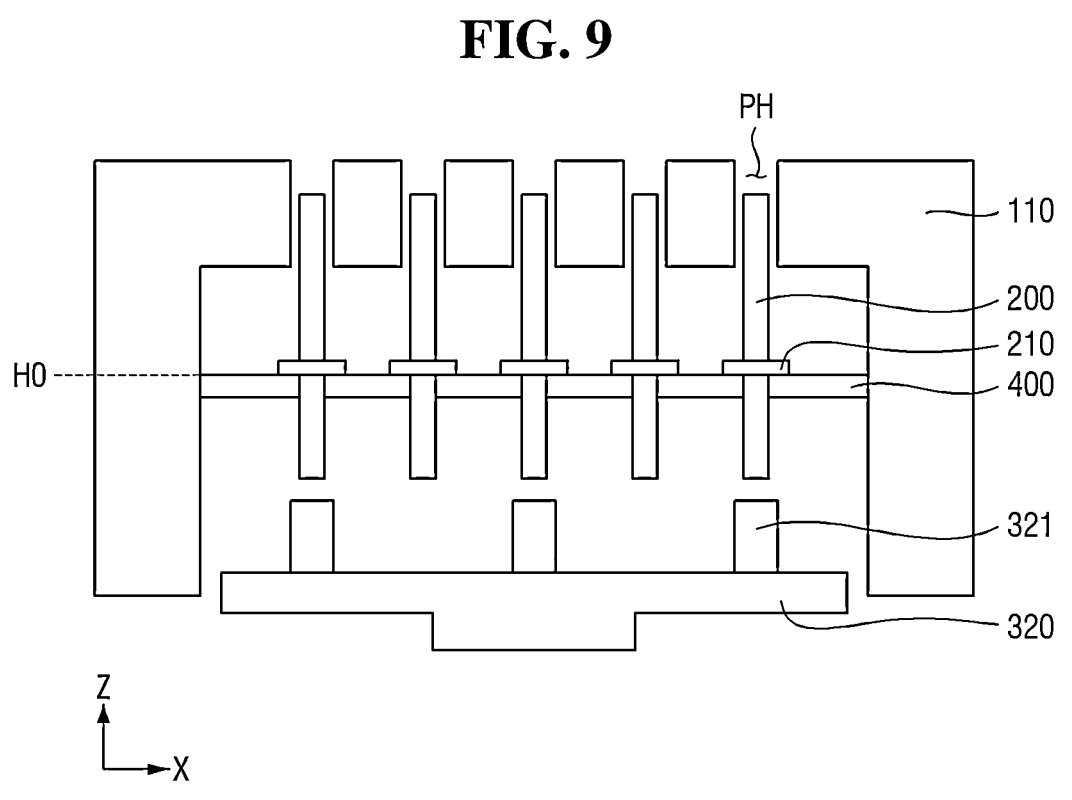
Figure 10:
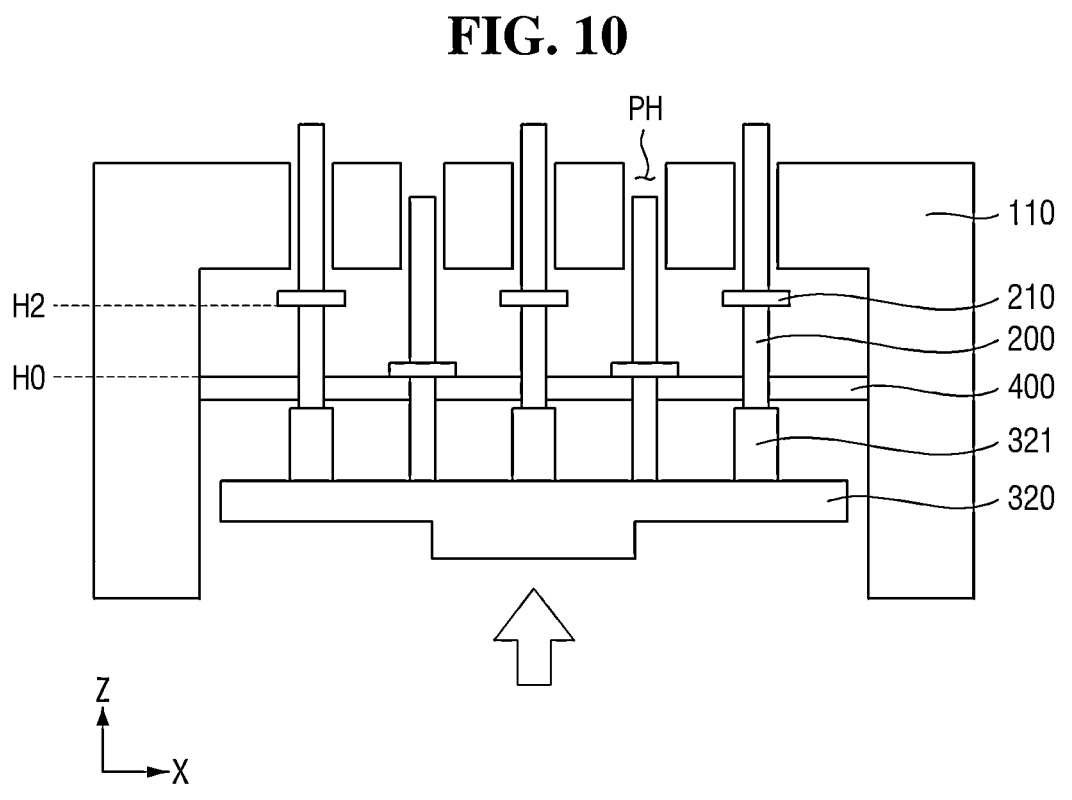

FIGS. 9 to 11 are views illustrating an operation of a pin disk and a pin ejector according to some embodiments;

FIGS. 12 to 15 are views illustrating a pin disk according to some embodiments;

Figure 24:
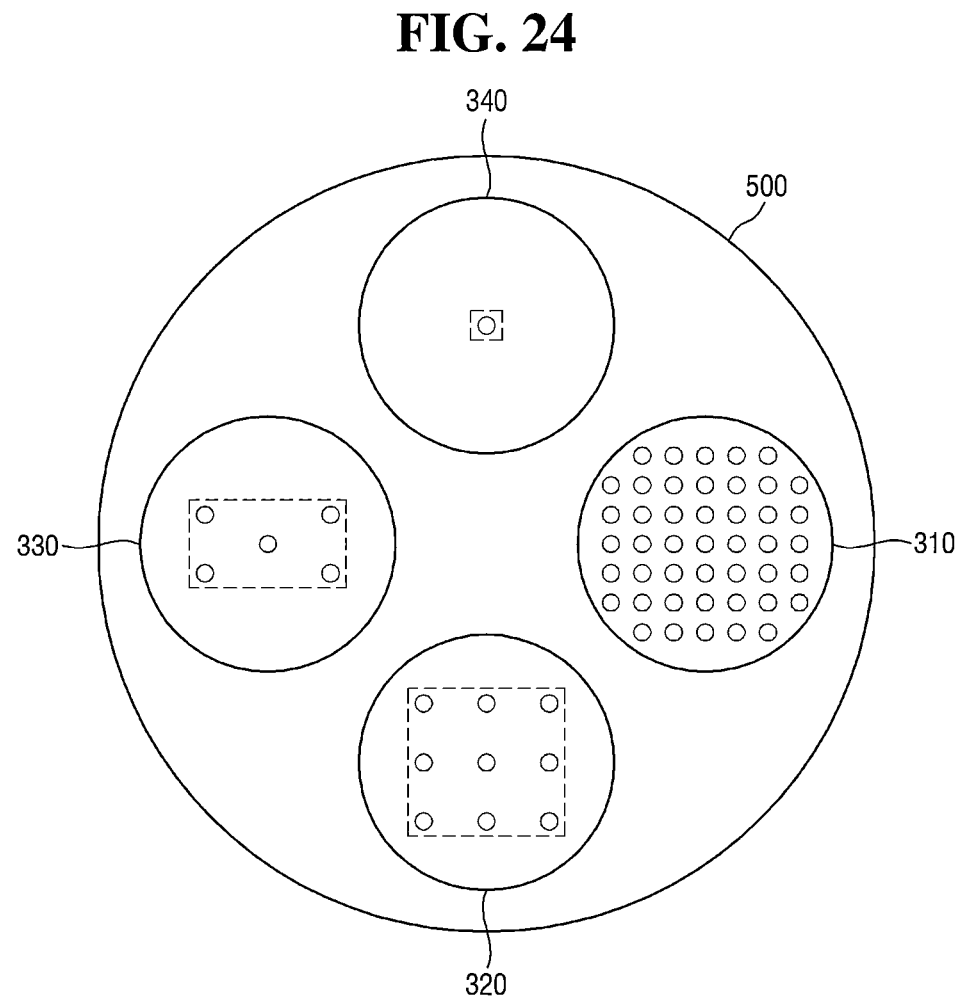

FIGS. 23 to 25 are views illustrating a semiconductor package manufacturing method using a semiconductor package manufacturing apparatus according to some embodiments.

DETAILED DESCRIPTION OF THE DISCLOSURE

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

Figure 1:
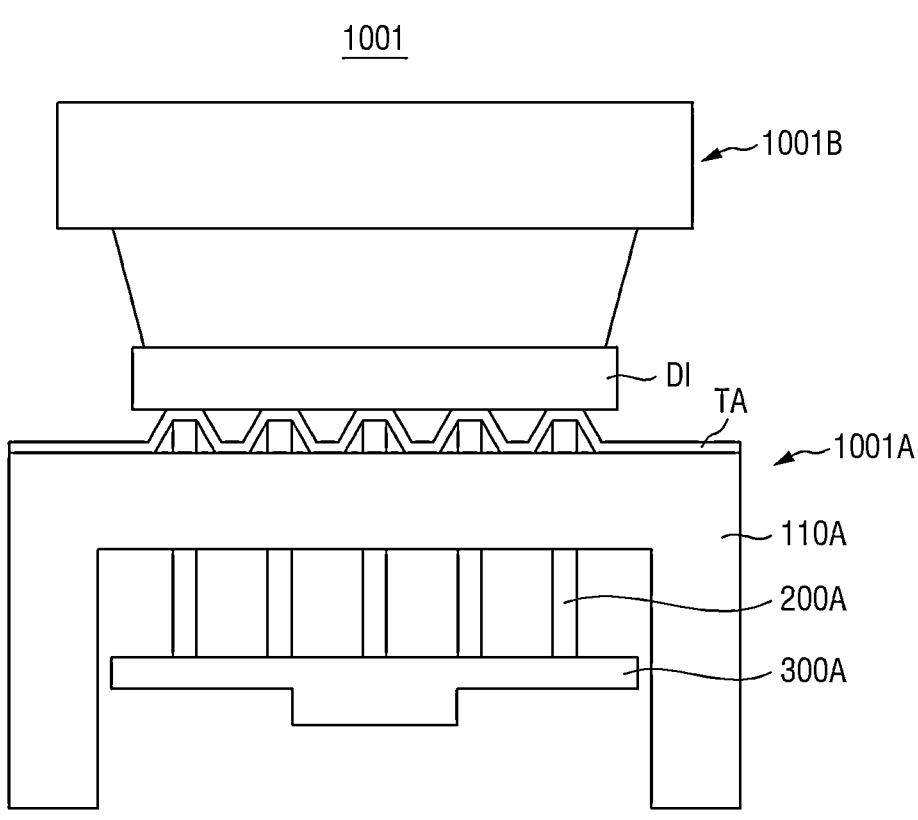
FIG. 1 is a view illustrating a semiconductor package manufacturing apparatus of the related art.

FIG. 1 is a view illustrating a semiconductor package manufacturing apparatus of the related art.

Referring to FIG. 1, a semiconductor package manufacturing apparatus 1001 of the related art may include a die ejecting unit 1001A and a pickup unit 1001B.

The die ejecting unit 1001A may be provided to be driven in a vertical direction to separate a tape TA from a die DI.

The die ejecting unit 1001A may include a pin ejector 200A for separating the tape TA from the die DI, a pin holder 110A including the pin ejector 200A, and a pin disk 300A below the pin ejector 200A.

Although not shown in detail, the pickup unit 1001B may pick up the separated die DI and attach the die DI onto the substrate.

Figure 2:
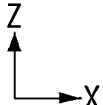
FIG. 2 is a schematic view illustrating a semiconductor package manufacturing apparatus according to some embodiments.
Figure 3:
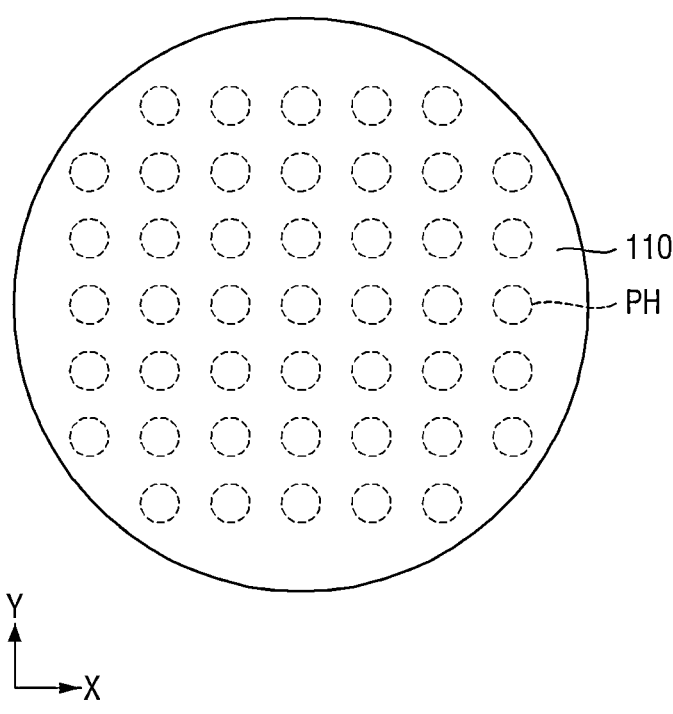
FIG. 3 is a view illustrating a pin holder and a through hole of FIG. 2.
Figure 4:
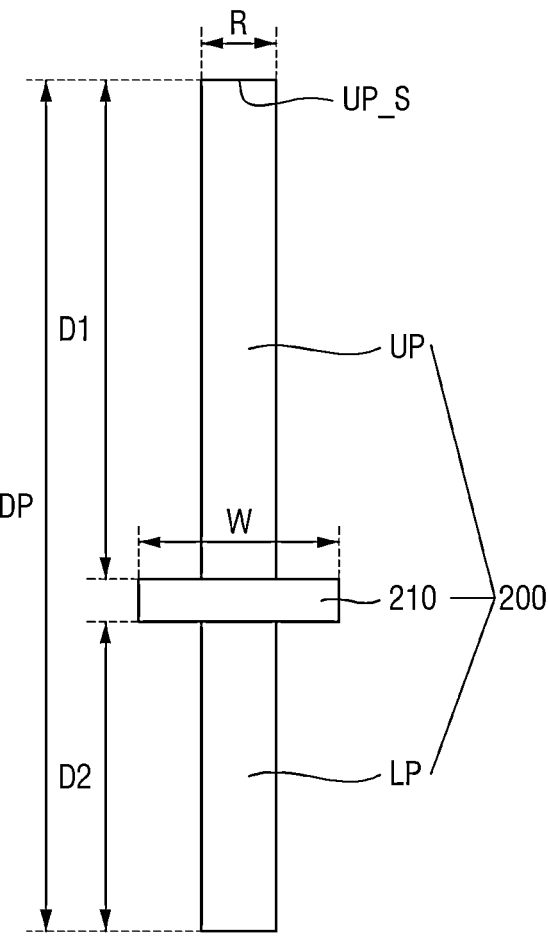
FIG. 4 is a view illustrating a shape of a pin ejector according to some embodiments.
Figure 5:
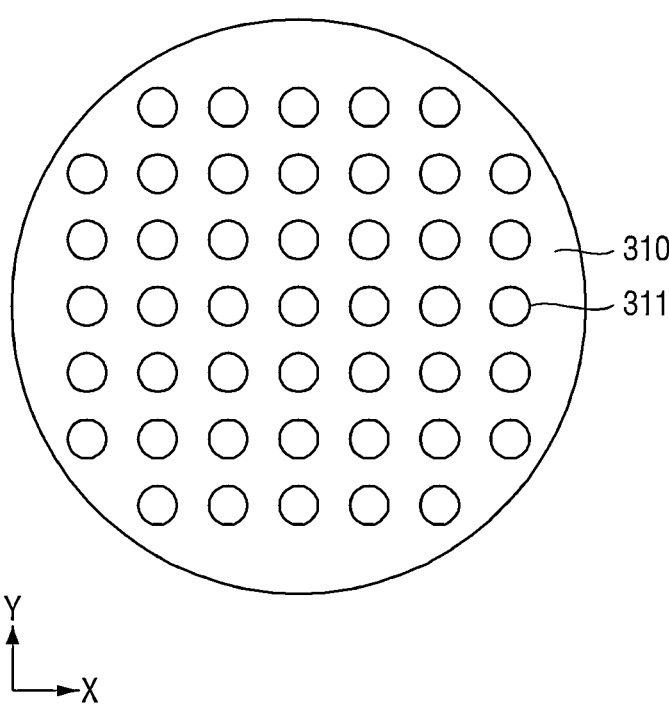
FIG. 5 is a view illustrating a pin disk according to some embodiments.
Figure 6:
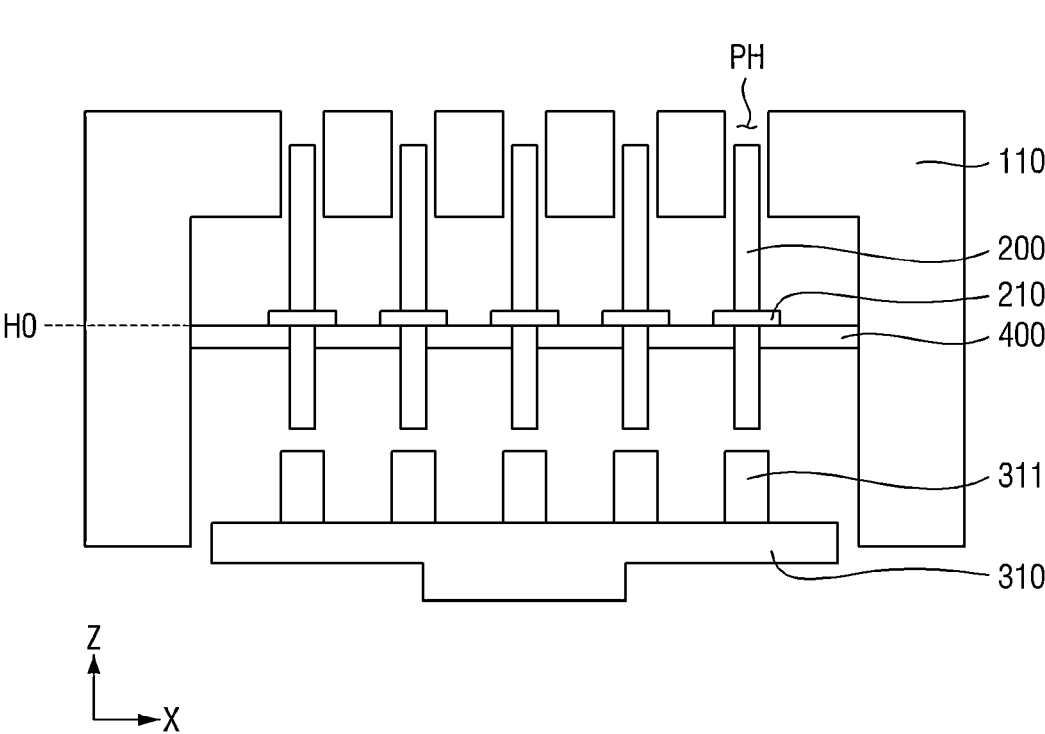
FIGS. 6 and 7 is a view illustrating an operation of a pin disk and a pin ejector according to some embodiments.
Figure 7:
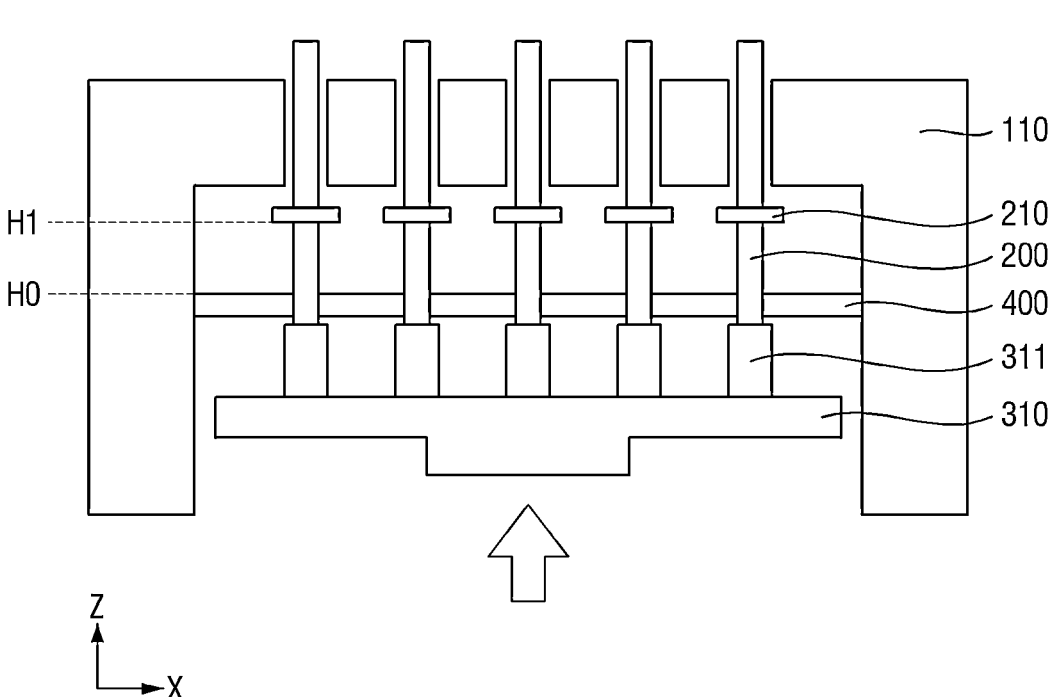

FIG. 2 is a schematic view illustrating a semiconductor package manufacturing apparatus according to some embodiments. FIG. 3 is a view illustrating a pin holder and a through hole of FIG. 2. FIG. 4 is a view illustrating a shape of a pin ejector according to some embodiments. FIG. 5 is a view illustrating a pin disk according to some embodiments. FIGS. 6 and 7 are a view illustrating an operation of a pin disk and a pin ejector according to some embodiments.

Referring to FIG. 2, a semiconductor package manufacturing apparatus 1000 according to some embodiments may include a pin holder 110, an ejector pin 200, a pin disk 300, and a pin base 400.

In some embodiments, a first direction X and a second direction Y may mean a direction parallel with a lower surface of the pin holder 110 and/or an upper surface of the pin base 400, which will be described later. The first direction X and the second direction Y may cross each other. A third direction Z may be perpendicular to each of the first direction X and the second direction Y.

A housing 100 may provide an area in which the ejector pin 200 is driven. For example, the housing 100 may have a cylindrical shape extended in the third direction Z. The ejector pin 200, the pin disk 300, and the pin base 400, which will be described later, may be disposed inside the housing 100.

The pin holder 110 may be disposed on (or in) an upper portion of the housing 100. A portion of the ejector pin 200 may be inserted into the pin holder 110. The pin holder 110 includes a plurality of through holes PH passing through an upper surface 110U and a lower surface 110B of the pin holder 110. The ejector pins 200 may be inserted into the plurality of through holes PH.

A moving unit 120 driven to enable rotation of the pin disk 300 or movement of the pin disk 300 in the vertical direction Z may be disposed in the pin holder 100. The moving unit 120 is disposed below the pin disk 300. The moving unit 120 may ascend or descend the ejector pins 200 through the pin disk 300. For example, the moving unit 120 may include a motor, an actuator, a piston, pump, and/or the like. In at least one embodiment, the moving unit 120 may include gears, bearings, chucks, and/or pins to facilitate the rotation and to lock the moving unit 120 in place.

The pin ejector 200 may be formed to correspond to each of the plurality of through holes PH. Referring to FIG. 3, in view of a plane of the first and second directions X and Y, the pin ejector 200 may be formed to correspond to each of the plurality of through holes PH one-to-one. Therefore, in at least one embodiment, all of the plurality of ejector pins 200 may be protruded to the outside of the plurality of through holes PH, or only a portion of the plurality of ejector pins 200 may be protruded to the outside of the plurality of through holes PH.

Referring to FIG. 4, each of the plurality of ejector pins 200 may include an upper area UP between the pin holder 110 and the pin base 400, a lower area LP between the pin base 400 and a first protrusion 311, and a stopper 210 between the upper area UP and the lower area LP.

In at least one embodiment, a length D1 of the upper area UP may be longer than a length D2 of the lower area LP. At least one of the upper area UP and/or the lower area LP may have a flat shape. For example, the uppermost surface of the upper area UP may have a flat shape.

In at least one embodiment, a diameter R of the upper area UP may be substantially similar to and/or the same as that of the lower area LP. The diameter R of the upper area UP may be 0.5 mm to 0.68 mm.

Based on the third direction Z, the stopper 210 may be positioned at a point corresponding to ½ to ⅓ of an entire length DP of the ejector pin 200. In at least one embodiment, the entire length DP of the ejector pin 200 may be 6 mm to 13 mm.

A width W of the stopper 210 may be wider than the diameter R of the upper area UP and/or the lower area LP. The width W of the stopper 210 may be wider than a diameter of the through hole PH.

In at least one embodiment, the plurality of ejector pins 200 may include a metal material. For example, the ejector pin 200 may include at least one of a stainless metal, aluminum, a hard metal, and/or the like. The hard metal may include, e.g., tungsten, a cobalt alloy, and/or the like. In at least one embodiment, the ejector pin 200 may include a ceramic material and/or a metal/ceramic hybrid like tungsten carbide.

Referring back to FIG. 2, the pin disk 300 may include a first pin disk 310 including a first protrusion 311 for adjusting a height of the plurality of ejector pins 200. The pin disk 300 may include a metal material, a ceramic material, a metal/ceramic hybrid, and/or the like.

Referring to FIG. 5, the first protrusion 311 may be disposed on an upper surface of the first pin disk 310. The first protrusions 311 may be formed to respectively correspond to one of the plurality of ejector pins 200. For example, in at least one embodiment, the first protrusions 311 may correspond one-to-one with the plurality of ejector pins 200. In this case, the first protrusion 311 may be referred to as having a first arrangement.

The first protrusion 311 may include a magnetic material. For example, the first protrusion 311 may include a cobalt-based magnetic material. Therefore, when the vertical movement of the pin disk 300, which will be described later, is repeated, the first protrusion 311 may properly maintain the height of the pin disk 300, and/or may minimize vibration.

Referring to FIG. 6, before vertical movement of the pin disk 300, the first protrusion 311 may be spaced apart from the ejector pins 200 in the third direction Z.

The pin base 400 may set a reference height H0 of the plurality of ejector pins 200. The stopper 210 of the ejector pin 200 may be placed on the upper surface of the pin base 400.

Referring to FIG. 7, when the pin disk 300 vertically moves, all of the ejector pins 200 may be inserted into the through hole PH and protruded to the outside of the pin holder 110. The first protrusion 311 may be disposed below the pin base 400. The first protrusion 311 may ascend the plurality of ejector pins 200 as much as a first height H1 spaced apart from the reference height H0 by the moving unit 120. The stopper 210 of the ejector pin 200 may be disposed on a lower surface of the pin holder 110.

Therefore, the ejector pins 200 protruded out of the pin holder 110 may separate the die from the tape.

Figure 8:
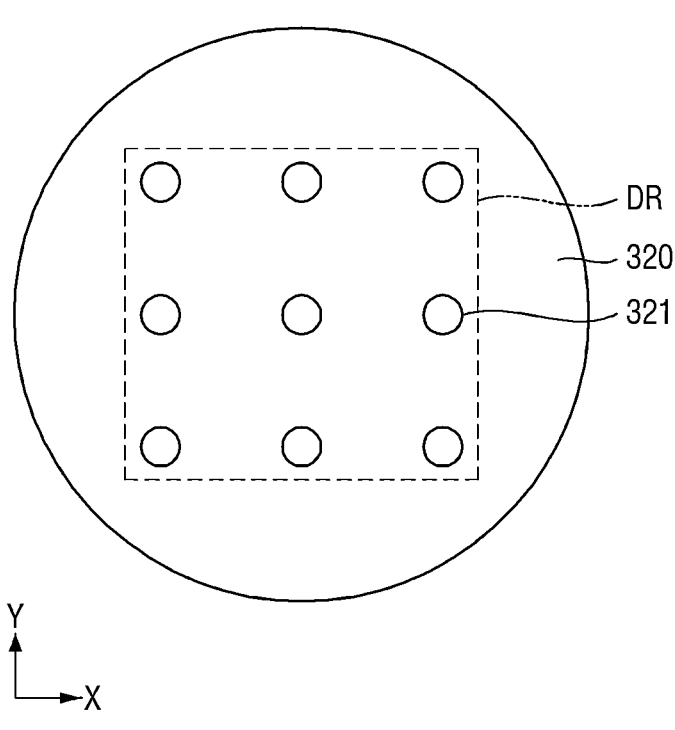
FIG. 8 is a view illustrating a pin disk according to some embodiments.
Figure 11:
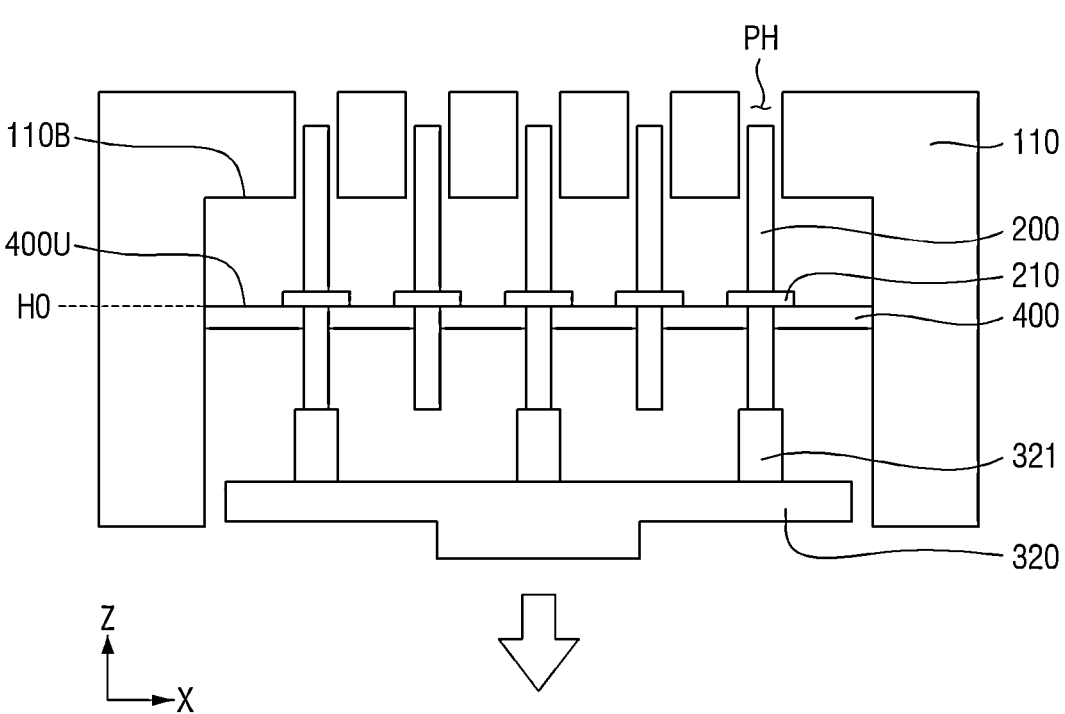

FIG. 8 is a view illustrating a pin disk according to some embodiments. FIGS. 9 to 11 are views illustrating an operation of a pin disk and a pin ejector according to some embodiments. For convenience of description, the same and/or substantially similar descriptions as that made with reference to FIGS. 1 to 7 may be omitted.

Referring to FIG. 8, the pin disk 300 may further include a second pin disk 320 including a second protrusion 321 for adjusting a height of the plurality of ejector pins 200.

The second protrusion 321 may be disposed on an upper surface of the second pin disk 310. The first protrusions 311 may be formed to respectively correspond to some of the plurality of ejector pins 200. In this case, the second protrusion 321 may have a second arrangement (or pattern), e.g., different from the first arrangement (or pattern). For example, the positioning and/or number of the second protrusion 321 may be different from the first protrusion 311.

For example, the second arrangement of the second protrusion 321 may be in the form of a 3×3 matrix, but the example embodiments are not limited thereto. Various modifications may be made in the second arrangement of the second protrusion 321 depending on a die arrangement region DR. Therefore, even when a size of the die to be bonded is changed, the change in the position and number of the ejector pins may be efficiently performed.

Referring to FIG. 9, before vertical ascending of the pin disk 300, the second protrusion 321 may be spaced apart from the ejector pins 200 in the third direction Z.

The pin base 400 may set a reference height H0 of the plurality of ejector pins 200. The stopper 210 of the ejector pin 200 may be placed on the upper surface of the pin base 400.

Referring to FIG. 10, when the pin disk 300 vertically ascends, a portion of the ejector pins 200 may be inserted into the through hole PH and protrude to the outside of the pin holder 110. The second protrusion 321 may be disposed below the pin base 400. The second protrusion 321 may ascend a portion of the plurality of ejector pins 200 as much as a second height H2 spaced apart from the reference height H0. The stopper 210 of the ejector pin 200 may be disposed on a lower surface of the pin holder 110.

Therefore, some ejector pins 200 protruded to the outside of the pin holder 110 may separate the die from the tape.

Referring to FIG. 11, a portion of the ejector pin 200 used to separate the die from the tape may vertically descend in contact with the second pin disk 320. The second protrusion 321 may descend at the reference height H0 by the moving unit 120. The stopper 210 of the ejector pin 200 may be again placed on the upper surface of the pin base 400.

In this process, a maximum height at which the ejector pin 200 ascends or descends may be maintained at a constant distance from an upper surface 400U of the pin base 400 to the lower surface 110B of the pin holder 110.

FIGS. 12 to 15 are views illustrating a pin disk according to some embodiments. For convenience of description, the same and/or substantially similar descriptions as that made with reference to FIGS. 1 to 11 may be omitted.

Figure 12:
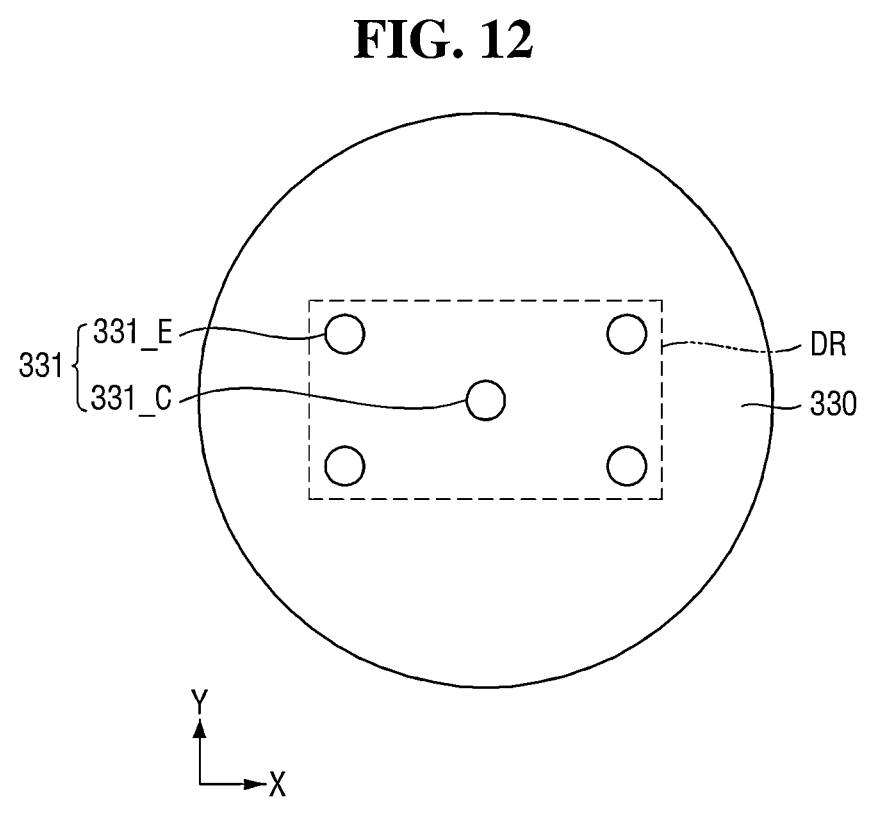

Referring to FIG. 12, the pin disk 300 may further include a third pin disk 330 including a third protrusion 331 for adjusting a height of the plurality of ejector pins 200.

The third protrusion 331 may be disposed on an upper surface of the third pin disk 330. The third protrusion 331 may be formed to respectively correspond to some of the plurality of ejector pins 200. In this case, the third protrusion 331 may have a third arrangement.

For example, the third arrangement of the third protrusion 331 may include four protrusions 331_E disposed at an edge portion of the die arrangement region DR and one protrusion 331_C arranged at a central portion thereof. In this case, a size of the die arrangement region DR may be smaller than that of the die arrangement region DR described with reference to FIGS. 1 to 11.

Figure 13:
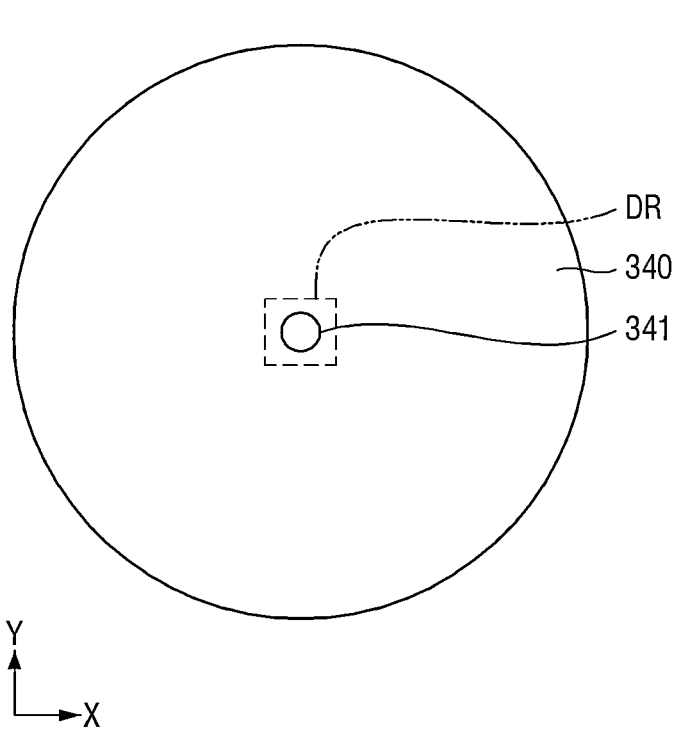

Referring to FIG. 13, the pin disk 300 may further include a fourth pin disk 340 including a fourth protrusion 341 for adjusting a height of the plurality of ejector pins 200.

The fourth protrusion 341 may be disposed on an upper surface of the fourth pin disk 340. The fourth protrusion 341 may be formed to correspond to one of the plurality of ejector pins 200. In this case, the fourth protrusion 341 may have a fourth arrangement.

For example, the fourth arrangement of the fourth protrusion 341 may mean a shape in which one protrusion is arranged in the die arrangement region DR. In this case, the size of the die arrangement region DR may be smaller than that of the die arrangement region DR described with reference to FIGS. 1 to 12.

Figure 14:
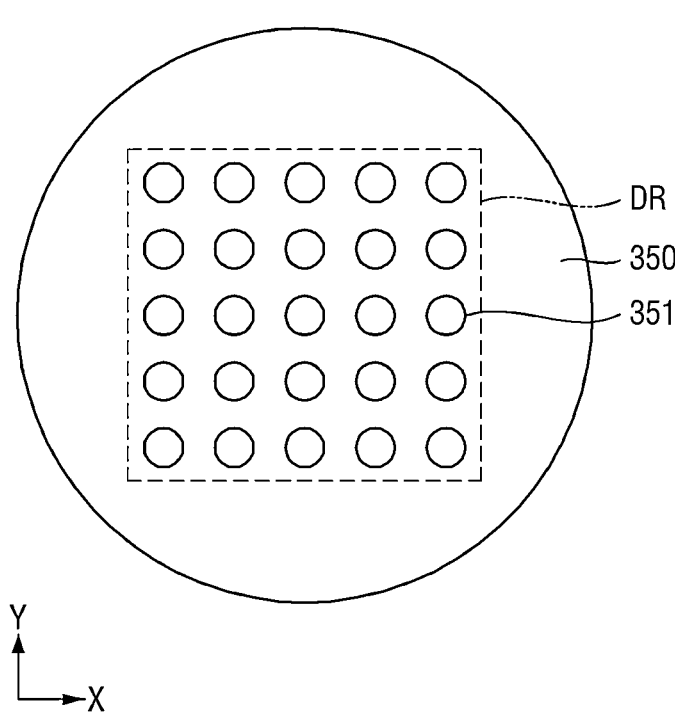

Referring to FIG. 14, the pin disk 300 may further include a fifth pin disk 350 including a fifth protrusion 351 for adjusting a height of the plurality of ejector pins 200.

The fifth protrusion 351 may be disposed on an upper surface of the fifth pin disk 350. The plurality of fifth protrusions 351 may be formed to correspond to some of the plurality of ejector pins 200. In this case, the fifth protrusion 351 may have a fifth arrangement.

For example, the fifth arrangement of the fifth protrusion 351 may refer to an arrangement in the form of a 5×5 matrix.

Figure 15:
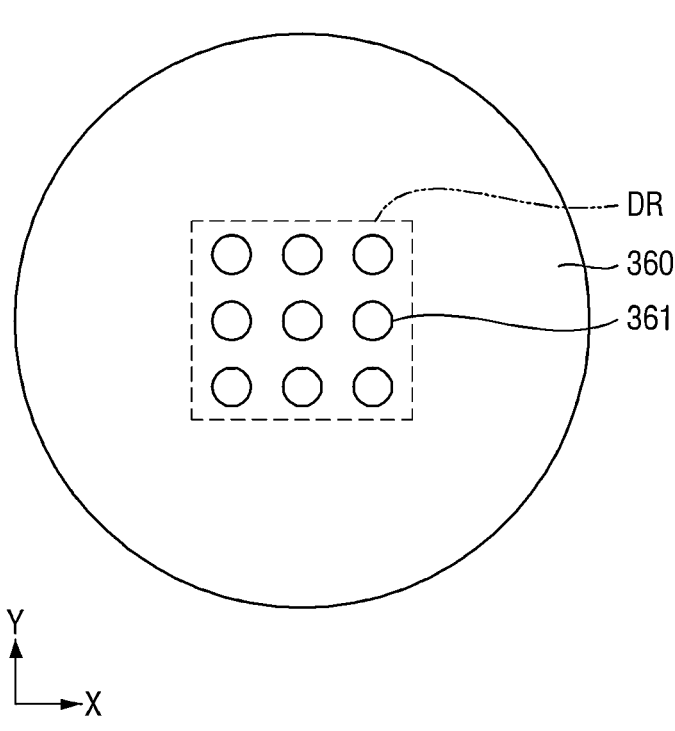

Referring to FIG. 15, the pin disk 300 may further include a sixth pin disk 360 including a sixth protrusion 361 for adjusting a height of the plurality of ejector pins 200.

The sixth protrusion 361 may be disposed on an upper surface of the sixth pin disk 360. The plurality of sixth protrusions 361 may be formed to correspond to some of the plurality of ejector pins 200. In this case, the sixth protrusion 361 may have a sixth arrangement.

For example, the sixth arrangement of the sixth protrusion 361 may mean an arrangement in the form of a 3×3 matrix. In this case, the size of the die arrangement region DR may be smaller than that of the die arrangement region DR described with reference to FIG. 8. Further, a spaced distance between the protrusions 361 in the first direction X and/or the second direction Y may be smaller than the spaced distance between the protrusions 321 shown in FIG. 8.

Figure 16:
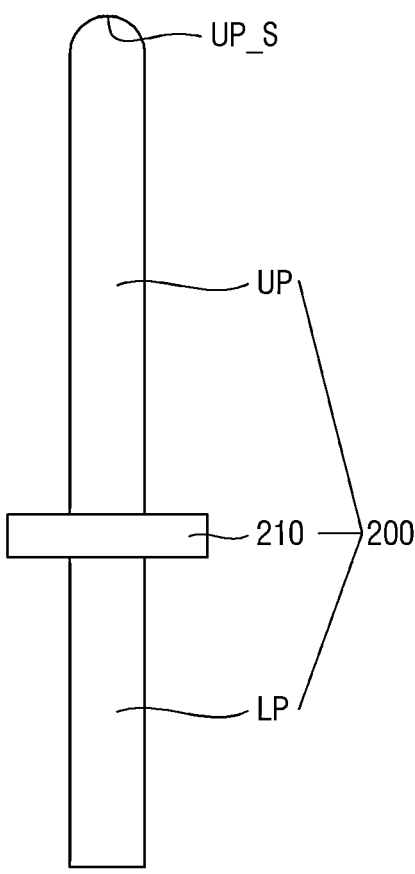
FIGS. 16 to 18 are views illustrating a shape of a pin ejector according to some embodiments.
Figure 17:
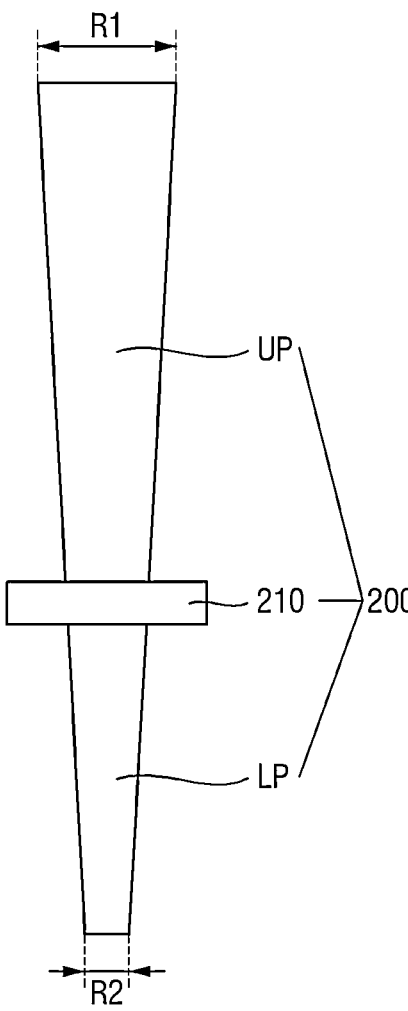
Figure 18:
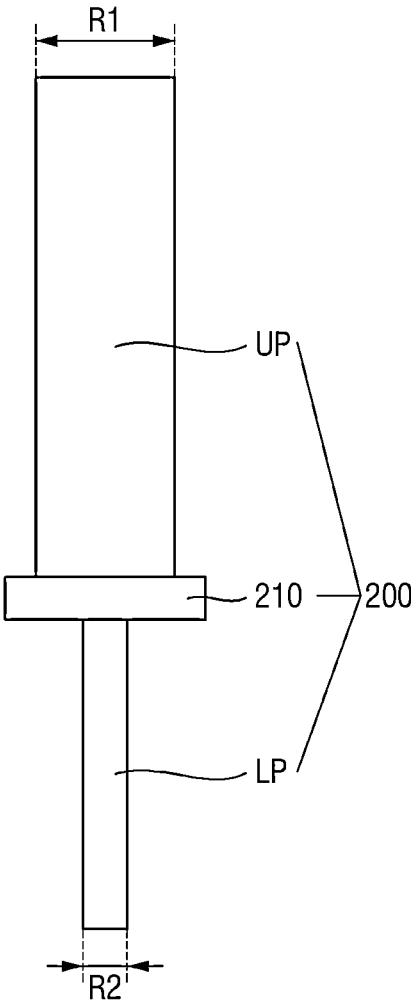

FIGS. 16 to 18 are views illustrating a shape of a pin ejector according to some embodiments. For convenience of description, the same and/or substantially similar descriptions as that made with reference to FIGS. 1 to 7 may be omitted.

Referring to FIG. 16, an upper surface UP_S of the upper area UP may include a curved surface. In at least one example, the diameter of the upper area UP may be smaller than the diameter R of the upper area UP shown in FIG. 4.

Meanwhile, the size of the die arrangement region DR and the number of the protrusions 311 may not be limited to those shown in FIGS. 8 and 12 to 15 described above. For example, one protrusion may be disposed in the die arrangement region DR of FIG. 8 in the same manner as the protrusion 341 of FIG. 13, but this is an example, and the embodiments of the present disclosure are not limited thereto.

Referring to FIG. 17, a diameter R1 of the upper area UP may be greater than a diameter R2 of the lower area LP. In this case, one cross section of the ejector pin 200 may have a tapered shape. Therefore, in the case that only a portion of the ejector pin 200 corresponds to the protrusion, the lower area LP of the ejector pin 200, which is not used for separating the die from the tape, may be smoothly disposed in an area between the protrusions.

Referring to FIG. 18, the diameter R1 of the upper area UP may be greater than the diameter R2 of the lower area LP. For example, the diameter R1 of the upper area UP may be discontiguous and/or discontinuous with the diameter R2 of the lower area LP. In at least one embodiment, one cross section of the ejector pin 200 may have a rectangular shape.

Though some examples are illustrated in reference to FIGS. 16 and 18, the example embodiments are not limited thereto. For example, the examples may be combined such that elements of the above examples may be combined with elements of other examples. For example, at least one example of a pin ejector may have at least one of a rounded upper surface, a tapered profile, and/or a discontiguous and/or discontinuous upper and lower diameter.

Figure 19A:
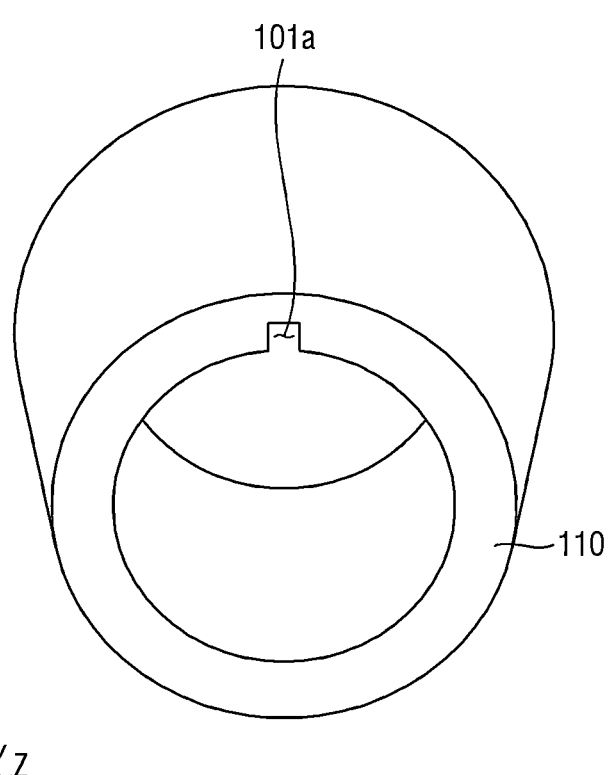
FIGS. 19A and 19B are views illustrating shapes of a pin holder and a pin disk according to some embodiments.
Figure 19B:
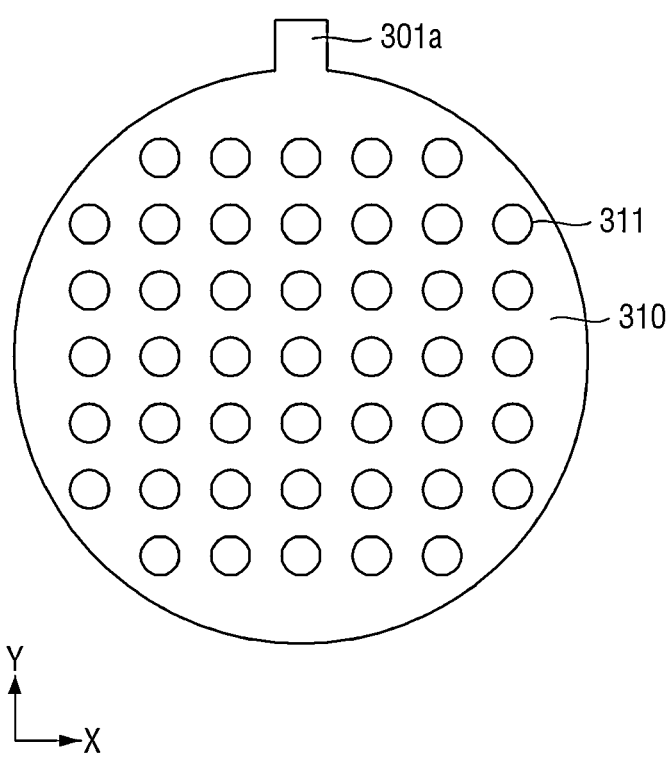
Figure 20A:
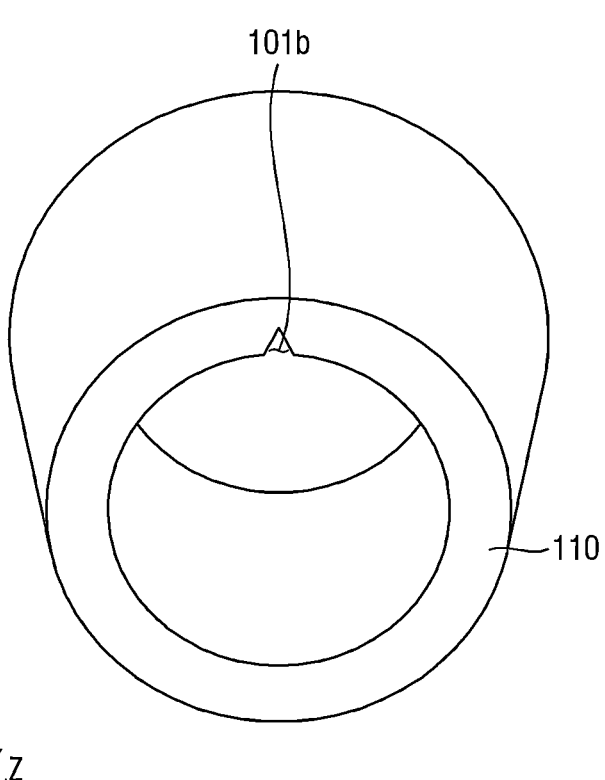
FIGS. 20A and 20B are views illustrating shapes of a pin holder and a pin disk according to some embodiments.
Figure 20B:
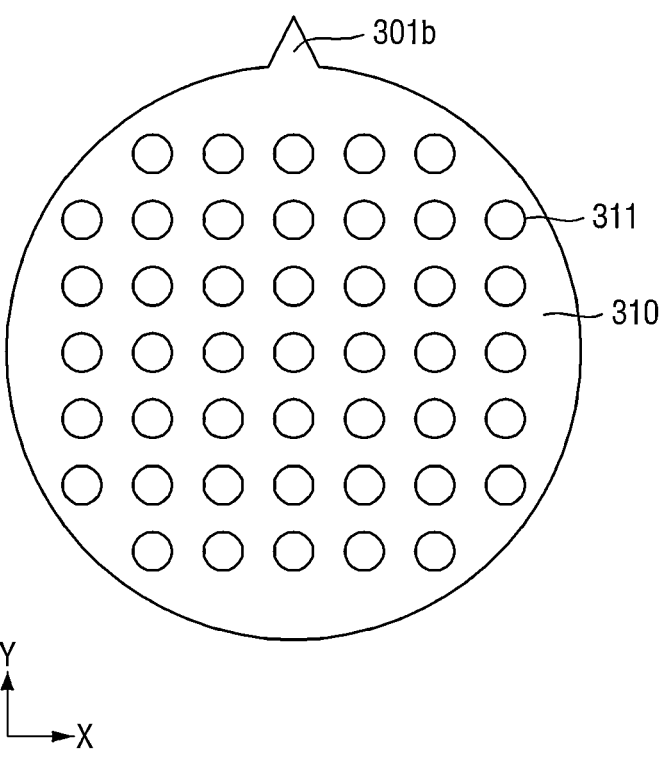
Figure 21A:
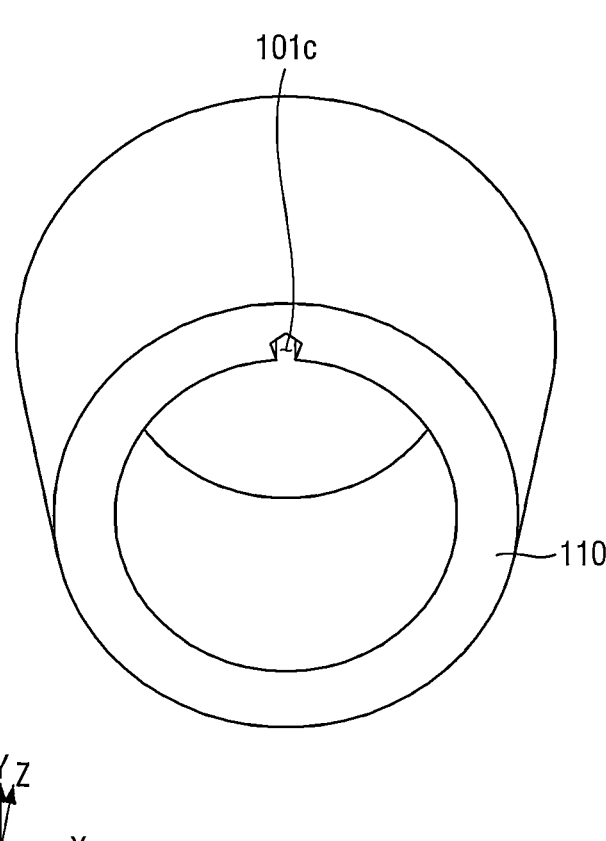
FIGS. 21A and 21B are views illustrating shapes of a pin holder and a pin disk according to some embodiments.
Figure 21B:
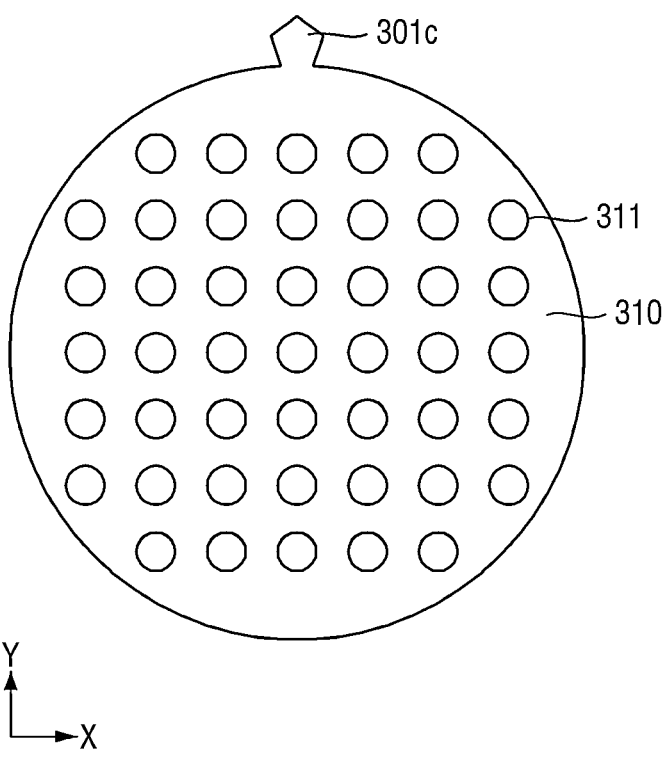
Figure 22A:
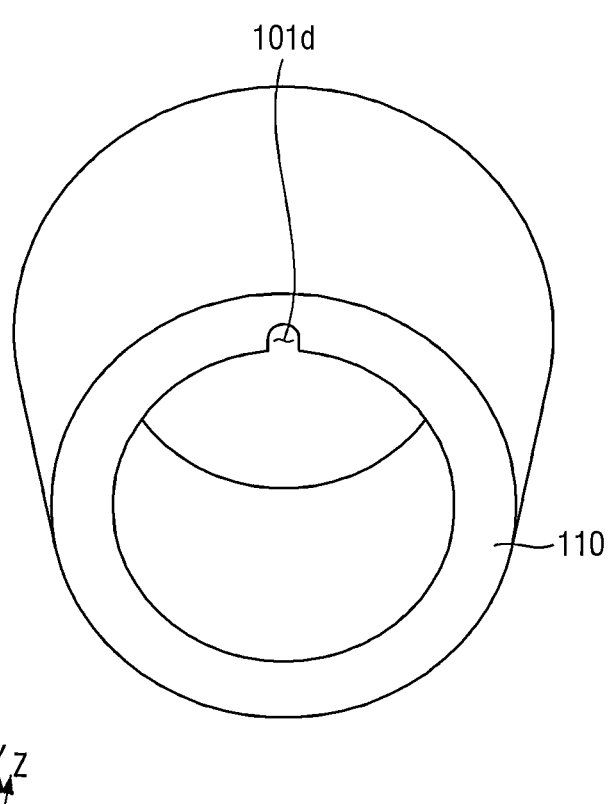
FIGS. 22A and 22B are views illustrating shapes of a pin holder and a pin disk according to some embodiments.
Figure 22B:
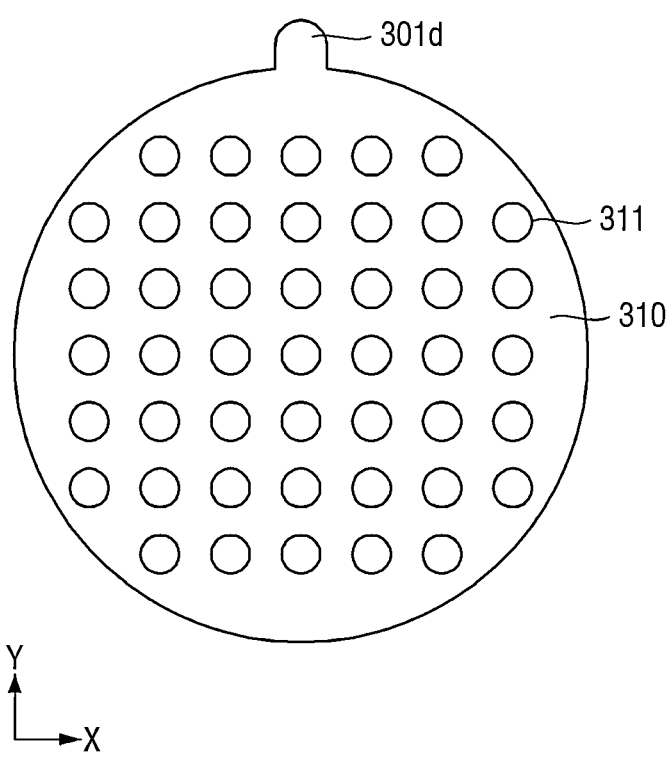

FIGS. 19A and 19B are views illustrating shapes of a pin holder and a pin disk according to some embodiments. FIGS. 20A and 20B are views illustrating shapes of a pin holder and a pin disk according to some embodiments. FIGS. 21A and 21B are views illustrating shapes of a pin holder and a pin disk according to some embodiments. FIGS. 22A and 22B are views illustrating shapes of a pin holder and a pin disk according to some embodiments.

Referring to FIGS. 19A and 19B, the first pin disk 310 may include a first identification portion 301*a* protruded in, e.g., the second direction Y parallel with an upper surface of the first pin disk 310. In this case, the pin holder 110 may include a first groove 101*a* formed to be recessed and to correspond to the first identification portion 301*a*. In this case, each of the first identification portion 301*a* and the first groove 101*a* may be formed in a rectangular shape. The first identification portion 301*a* and the first groove 101*a* may also be referred to as a key and a keyway, respectively.

Therefore, a direction in which the first pin disk 310 is disposed on the support 500, which will be described later, may be identified. In addition, when the first pin disk 310 vertically moves, the first protrusion 311 may smoothly move without being caught by the pin holder 110.

Meanwhile, various modifications may be made in a shape of the identification portion and a shape of the groove without limitation to those shown in FIGS. 19A and 19B. For example, the shape of the identification portion and the shape of the groove may be formed in a triangular shape as shown in FIGS. 20A and 20B, a pentagonal shape as shown in FIGS. 21A and 21B, and/or a circular shape as shown in FIGS. 22A and 22B.

Also, although FIG. 19B shows the first protrusion 311, the technical spirits of the present disclosure are not limited thereto. The protrusions applied to FIGS. 19B, 20B, 21B and 22B may be any one of the first to sixth protrusions 311 to 361 described above or other protrusions having various shapes.

Figure 23:
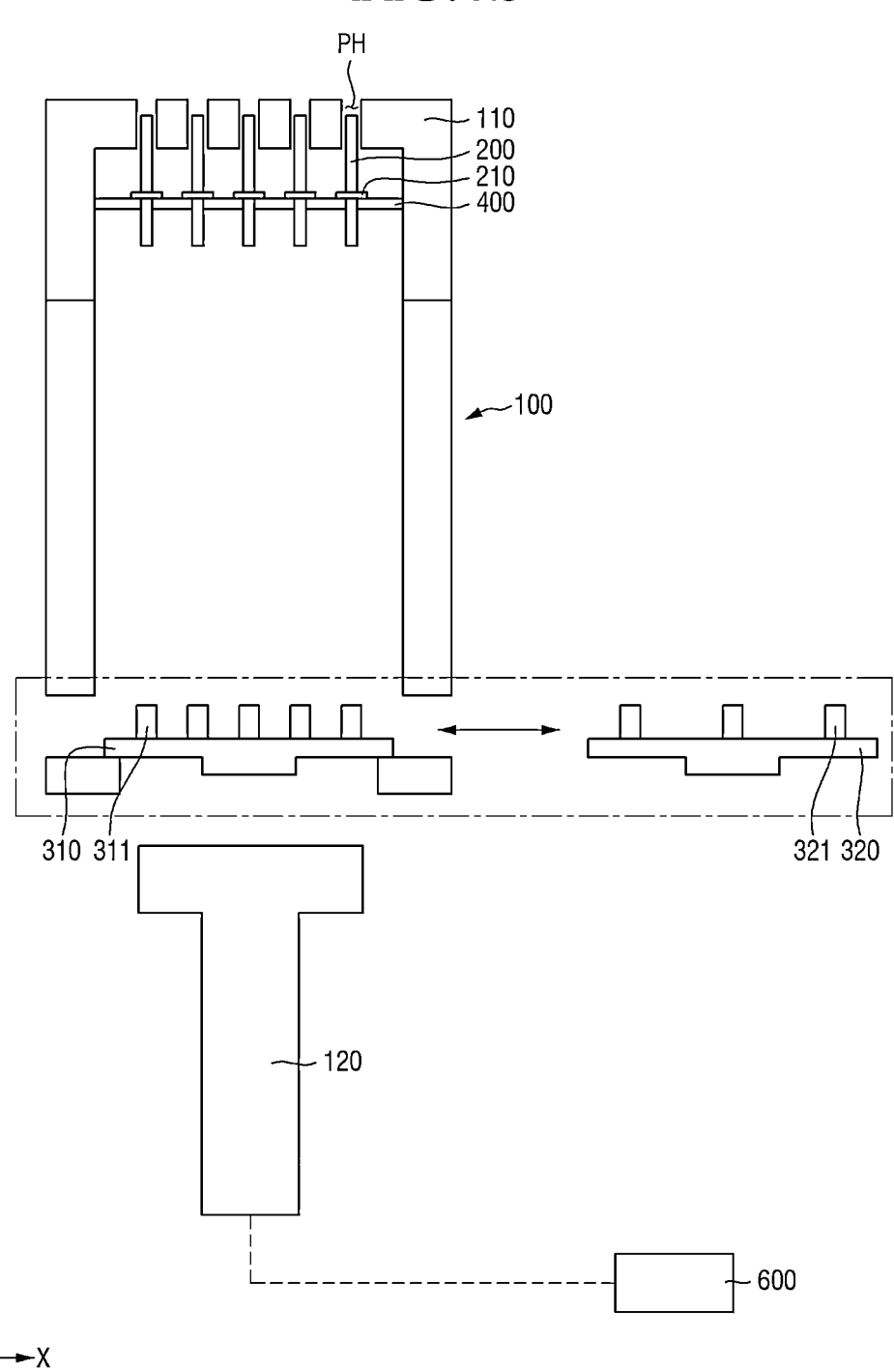
Figure 25:
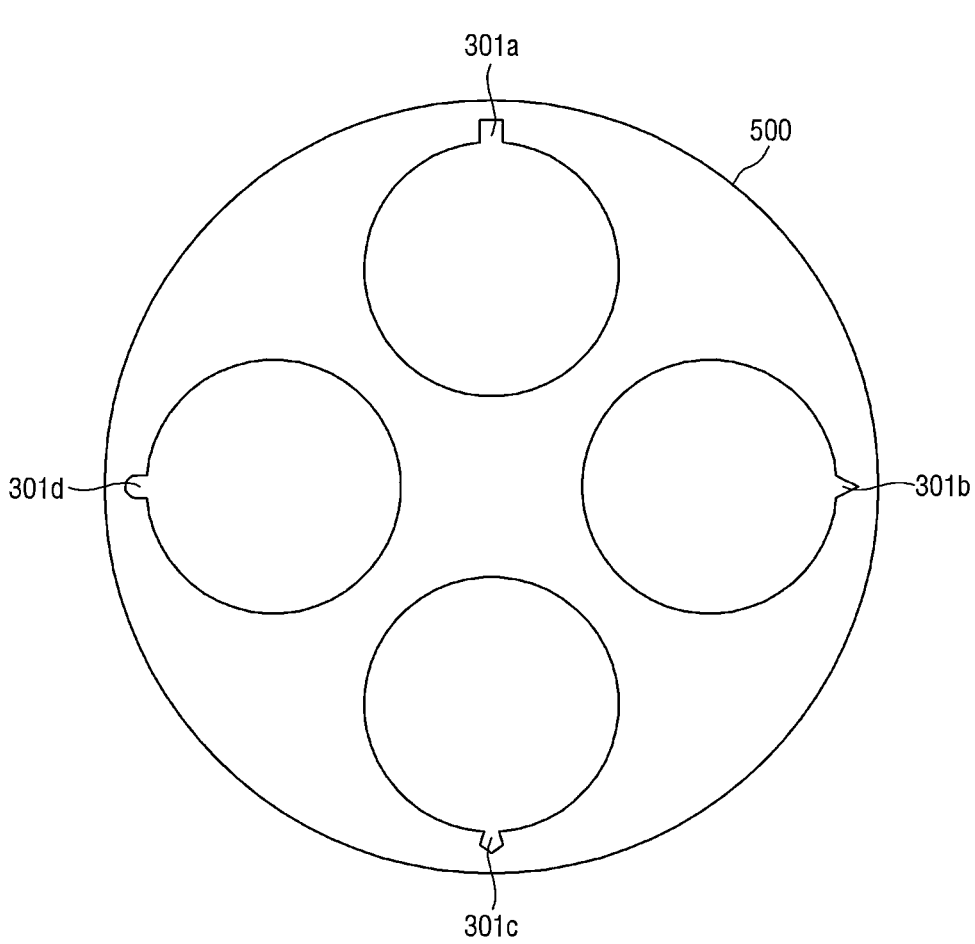

FIGS. 23 to 25 are views illustrating a semiconductor package manufacturing method using a semiconductor package manufacturing apparatus according to some embodiments. For convenience of description, the same and/or substantially similar descriptions as that made with reference to FIGS. 1 to 22 may be omitted.

The pin disk 300 described above is seated on the support 500. Referring to FIG. 23, a turn-table type support 500 on which the first and second pin disks 310 and 320 are seated and rotatable may be provided.

Although not shown in detail, the support 500 may be connected to, e.g., a motor that provides a rotational force.

A controller 600 may select and/or replace a plurality of ejector pins 200 protruded from an upper portion of the pin holder 110. For example, the controller 600 may select a plurality of ejector pins 200 protruded toward an upper portion of the pin holder 110 by replacing the first pin disk 310 on the support 500 with the second pin disk 320. In at least one example, the controller 600 may include processing circuitry such as hardware, software, or a combination thereof configured to perform a specific function. For example, the processing circuitry more specifically may be and/or include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), electrical components (such as at least one of transistors, resistors, capacitors, logic gates (including at least one of AND gates, OR gates, NOR gates, NAND gates, NOT gates, XOR gates, etc.), and/or the like).

Meanwhile, the number and kinds of pin disks selected and/or replaced in a turn-table manner are not limited to that shown in FIG. 23. For example, the controller 600 may select a plurality of ejector pins 200 protruded toward the upper portion of the pin holder 110 by replacing the first pin disk 310 on the support 500 with the second to sixth pin disks 320 to 360, but the example embodiments of the present disclosure are not limited thereto. A pin disk including protrusions of various shapes may be selected depending on the size of the die to be bonded.

For example, referring to FIG. 24, a turn-table type support 500 on which the first to fourth pin disks 310 to 340 are seated and rotatable may be provided. The support 500 may rotate in one or both directions. The support 500 may be disposed on the moving unit 120, which enables rotational movement to rotate the first to fourth pin disks 310 to 340.

The first to fourth pin disks 310 to 340 are not limited to those shown in FIG. 24 and may refer to any one of the first to sixth pin disks 310 to 360 described above, but the example embodiments of the present disclosure are not limited thereto. It is to be understood that pin disks of various types may be provided depending on the size of the die to be bonded.

For example, referring to FIG. 25, the first to fourth identification portions 301a to 301d may be disposed on the support 500 in different directions. On the support 500, the first identification portion 301a may be disposed in a 12 o'clock direction, the second identification portion 301b may be disposed in a 9 o'clock direction, the third identification portion 301c may be disposed in an 18 o'clock direction, and the fourth identification portion 301d may be disposed in a 21 o'clock direction. Therefore, a disk having a protrusion corresponding to the ejector pin to be used may be more easily identified. As a result, the disk may be more efficiently selected or replaced.

A semiconductor package may be manufactured using the semiconductor package manufacturing apparatus according to some embodiments.

In this case, the semiconductor package manufacturing apparatus, which includes the pin holder 110, the plurality of ejector pins 200, the first pin disk 310, the second pin disk 320, the pin base 400, the support 500 and the controller 600, may be used.

The pin base 400 may set a reference height H0 of the plurality of ejector pins 200.

Each of the plurality of ejector pins 200 may include an upper area UP between the pin holder 110 and the pin base 400, a lower area LP between the pin base 400 and the first and second protrusions 311 and 321, and a stopper 210 between the upper area UP and the lower area LP.

The pin holder 110 may include a plurality of through holes PH. The plurality of ejector pins 200 may be formed to correspond to a plurality of through holes PH and may separate the die and the tape as described below.

First, a first pin disk 310, which includes first protrusions 311 of a first arrangement, may be disposed on the support 500.

The first pin disk 310 may include first protrusions 311 having a first arrangement to adjust the height of the plurality of ejector pins 200. For example, the first arrangement of the first protrusions 311 may be in a shape corresponding to the plurality of ejector pins 200 one-to-one.

In a first state, the stopper 210 of each of the plurality of ejector pins 200 may be disposed on the upper surface 400U of the pin base 400.

In a second state, the stopper 210 of each of the plurality of ejector pins 200, which corresponds to the first protrusions 311, may be spaced apart from the upper surface 400U of the pin base 400 as much as the first height H1 and disposed on the lower surface 110B of the pin holder 110.

Therefore, the first protrusions 311 may ascend the plurality of ejector pins 200 as much as the first height h1.

Afterwards, the plurality of ejector pins 200 may be protruded toward the upper portion of the pin holder 110 by the first pin disk 310.

Afterwards, the first die and the tape TA may be separated from each other.

Afterwards, the support 500 may be rotated to replace the first pin disk 310 with the second pin disk 320. The replacement of the pin disk may be performed by the turn-table manner described above. The replacement of the pin disk may be performed by the controller 600. As a result, a worker may select an ejector pin suitable for a size of the die by only replacing the pin disk without replacing the ejector pins one by one.

Next, a second pin disk 320, which includes second protrusions 321 of a second arrangement, may be disposed on the support 500.

The second pin disk 320 may include second protrusions 321 having a second arrangement to adjust the height of the plurality of ejector pins 200. For example, the second arrangement of the second protrusion 321 may be in a shape corresponding to the plurality of ejector pins 200 one-to-one.

In a first state, the stopper 210 of each of the plurality of ejector pins 200 may be disposed on the upper surface 400U of the pin base 400.

In a second state, the stopper 210 of each of the plurality of ejector pins 200, which corresponds to the second protrusions 321, may be spaced apart from the upper surface 400U of the pin base 400 as much as the first height H1 and disposed on the lower surface 110B of the pin holder 110.

Therefore, the second protrusion 321 may ascend the plurality of ejector pins 200 as much as the first height h1.

Afterwards, the plurality of ejector pins 200 may be protruded toward the upper portion of the pin holder 110 by the second pin disk 320.

Afterwards, the second die and the tape TA may be separated from each other.

According to some embodiments, a third pin disk 330, which includes third protrusions 331 of a third arrangement, and a fourth pin disk 340, which includes fourth protrusions 341 of a fourth arrangement, may be disposed on the support 500. The third and fourth arrangements may be different from the first and second arrangements described above.

The first pin disk 310 on the support 500 may be replaced with any one of the second to fourth pin disks 320 to 340 to select the plurality of ejector pins 200 protruded toward the upper portion of the pin holder 110.

In some embodiments, the pin disk may be replaced through an automated system, so that the change in the position and number of the ejector pins may be efficiently performed.

Although the embodiments of the present disclosure have been described with reference to the accompanying drawings, it will be apparent to those skilled in the art that the present disclosure can be fabricated in various forms without being limited to the above-described embodiments and can be embodied in other specific forms without departing from the spirit and essential characteristics of the specification. Thus, the above embodiments are to be considered in all respects as illustrative and not restrictive.

What is claimed is:

1. A semiconductor package manufacturing apparatus comprising:

a pin holder including a plurality of through holes;

a plurality of ejector pins corresponding to the plurality of through holes;

a first pin disk including a first protrusion pattern having a first arrangement configured to adjust heights of the plurality of ejector pins;

a second pin disk including a second protrusion pattern having a second arrangement configured to adjust the heights of the plurality of ejector pins;

a pin base setting a reference height of the plurality of ejector pins; and a controller configured to select at least a portion of the plurality of ejector pins to protrude toward an upper portion of the pin holder by selecting one of the first pin disk or the second pin disk, wherein, when set at the reference height, each of the plurality of ejector pins includes an upper area between the pin holder and the pin base, a lower area between the pin base and one of the first protrusion pattern and the second protrusion pattern, and a stopper between the upper area and the lower area.

11

2. The semiconductor package manufacturing apparatus of claim 1, wherein at least one of the first protrusion pattern and the second protrusion patterns is disposed below the pin base and configured to ascend the selected ejector pins as much as a first height spaced from the reference height.

3. The semiconductor package manufacturing apparatus of claim 1, wherein the first protrusion pattern includes a plurality of first protrusions having the first arrangement such that each of the plurality of ejector pins has a corresponding first protrusion.

4. The semiconductor package manufacturing apparatus of claim 3, wherein the second protrusion pattern includes a plurality of second protrusions having the second arrangement such that each of the plurality of second protrusions corresponds to one of the portion of the plurality of ejector pins.

5. The semiconductor package manufacturing apparatus of claim 1, wherein each of the first protrusion pattern and the second protrusion patterns includes a magnetic material.

6. The semiconductor package manufacturing apparatus of claim 1, wherein the first pin disk includes a first identification key protruding in a first direction parallel with an upper surface of the first pin disk, and the pin holder includes a first groove that corresponds to the first identification key and is recessed in the first direction.

7. The semiconductor package manufacturing apparatus of claim 1, further comprising:

a third pin disk including a third protrusion pattern having a third arrangement configured to adjust the heights of the plurality of ejector pins; and a fourth pin disk including a fourth protrusion pattern having a fourth arrangement configured to adjust the heights of the plurality of ejector pins, wherein the controller is configured to select which of the plurality of ejector pins protrudes toward the upper portion of the pin holder by selecting one of the first pin disk, the second pin disk, the third pin disk, and the fourth pin disk.

8. The semiconductor package manufacturing apparatus of claim 7, further comprising:

a support on which at least one of the first pin disk, the second pin disk, the third pin disk, and the fourth pin disk is seated, the support configured to be rotatable, wherein the controller is configured to select which of the plurality of ejector pins protrude toward the upper portion of the pin holder by replacing the at least one of the first pin disk, the second pin disk, the third pin disk, and the fourth pin disk on the support with another one of the first pin disk, the second pin disk, the third pin disk, and the fourth pin disk.

9. The semiconductor package manufacturing apparatus of claim 8, wherein each of the first pin disk, the second pin disk, the third pin disk, and the fourth pin disk includes a first identification portion, a second identification portion, a third identification portion, and a fourth identification portion, and the first identification portion, the second identification portion, the third identification portion, and the fourth identification portions having different shapes from each other and disposed in different directions on the support.

10. A semiconductor package manufacturing apparatus comprising:

a plurality of ejector pins;

a pin holder including a plurality of through holes corresponding to the plurality of ejector pins;

a pin base configured to set a reference height for the plurality of ejector pins;

a pin disk disposed below the pin base, including a protrusion pattern configured to ascend at least a portion of the plurality of ejector pins as much as a first height spaced from the reference height; and a controller configured to select the portion of the plurality of ejector pins to protrude toward an upper portion of the pin holder by controlling a height of the pin disk, wherein the semiconductor package manufacturing apparatus is configured such that the pin disk is removable and such that the plurality of ejector pins remain during the removal of the pin disk, and wherein, when set at the reference height, each of the plurality of ejector pins includes an upper area between the pin holder and the pin base, a lower area between the pin base and the protrusion pattern, and a stopper between the upper area and the lower area.

11. The semiconductor package manufacturing apparatus of claim 10, wherein, in a first state, the stopper of each of the plurality of ejector pins is disposed on an upper surface of the pin base, and in a second state, the stopper of each of the selected ejector pins, which corresponds to the protrusion pattern, is disposed on a lower surface of the pin holder.

12. The semiconductor package manufacturing apparatus of claim 10, wherein a width of the upper area is wider than that of the lower area.

13. The semiconductor package manufacturing apparatus of claim 10, wherein the protrusion pattern includes a plurality of first protrusions such that each of the plurality of ejector pins has a corresponding first protrusion, and further comprising a second pin disk including a plurality of second protrusions such that each of the plurality of second protrusions corresponds to one of at least a portion of the plurality of ejector pins, and each of the plurality of first protrusions and the plurality of second protrusions includes a magnetic material.

14. The semiconductor package manufacturing apparatus of claim 10, further comprising:

a support on which the pin disk is seated, the support configured to be rotatable, wherein the controller is configured to select which of the plurality of ejector pins protrude toward the upper portion of the pin holder by controlling a height of the support.

15. A semiconductor package manufacturing method using a semiconductor package manufacturing apparatus, which comprises a pin holder including a plurality of through holes, a plurality of ejector pins corresponding to the plurality of through holes, a first pin disk including a first protrusion pattern having a first arrangement configured to adjust heights of the plurality of ejector pins, a second pin disk including a second protrusion pattern having a second arrangement configured to adjust the heights of the plurality of ejector pins, a pin base setting a reference height of the plurality of ejector pins, and a support on which at least one of the first pin disk and the second pin disk is seated, wherein each of the plurality of ejector pins, when set at the reference height, includes an upper area between the pin holder and the pin base, a lower area between the pin base and one of the first protrusion pattern and the second protrusion pattern, and a stopper between the upper area and the lower area, the semiconductor package manufacturing method comprising:

selecting at least a portion of the plurality of ejector pins to protrude toward an upper portion of the pin holder by replacing the at least one of the first pin disk and the second pin disk on the support with the other of the first pin disk and the second pin disk.

16. The semiconductor package manufacturing method of claim 15, wherein the selecting at least the portion of the plurality of ejector pins includes moving the selected ejector pins from a first state to a second state, such that in the first state, the stopper of each of the plurality of ejector pins is disposed on an upper surface of the pin base, and in the second state, the stopper of each of the selected ejector pins is disposed on a lower surface of the pin holder.

17. The semiconductor package manufacturing method of claim 15, wherein the semiconductor package manufacturing apparatus further includes a third pin disk including a third protrusion pattern having a third arrangement configured to adjust the height of the plurality of ejector pins; and a fourth pin disk including a fourth protrusion pattern having a fourth arrangement configured to adjust the height of the plurality of ejector pins, and wherein the method further comprises:

replacing the first pin disk on the support with one of the second pin disk, the second pin disk, and the fourth pin disks.

18. The semiconductor package manufacturing method of claim 15, wherein the selecting the portion of ejector pins is included in separating a tape from a die.

\* \* \* \* \*